United States Patent
Higgins et al.

(10) Patent No.: US 8,252,676 B2
(45) Date of Patent: Aug. 28, 2012

(54) METHOD FOR CONTAINING A SILICIDED GATE WITHIN A SIDEWALL SPACER IN INTEGRATED CIRCUIT TECHNOLOGY

(75) Inventors: Kelley Kyle Higgins, Austin, TX (US); Ibrahim Khan Burki, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 132 days.

(21) Appl. No.: 12/770,805

(22) Filed: Apr. 30, 2010

(65) Prior Publication Data

US 2010/0219486 A1   Sep. 2, 2010

Related U.S. Application Data

(63) Continuation of application No. 11/075,999, filed on Mar. 8, 2005, now Pat. No. 7,737,019.

(51) Int. Cl.
*H01L 21/3205* (2006.01)
*H01L 21/4763* (2006.01)
*H01L 21/02* (2006.01)

(52) U.S. Cl. ............... 438/595; 257/384; 257/E29.161; 257/E21.626

(58) Field of Classification Search ............ 438/595, 438/596; 257/384, E29.108, E29.161, E29.16, 257/E21.626, E21.636, E21.622, E21.64, 257/E21.165, E21.199, E21.619; 216/46
See application file for complete search history.

(56) References Cited

U.S. PATENT DOCUMENTS

| | | | |
|---|---|---|---|
| 6,015,747 A | 1/2000 | Lopatin et al. | |
| 6,069,032 A | 5/2000 | Lee | |
| 6,194,299 B1 | 2/2001 | Buynoski | |
| 6,251,732 B1* | 6/2001 | Hsu | 438/276 |
| 6,395,596 B1* | 5/2002 | Chien et al. | 438/241 |
| 6,475,906 B1 | 11/2002 | Lee | |
| 6,559,010 B1 | 5/2003 | Kuo et al. | |
| 6,620,718 B1 | 9/2003 | Wieczorek et al. | |
| 6,784,098 B1 | 8/2004 | Lou | |
| 6,890,808 B2 | 5/2005 | Chidambarrao et al. | |
| 7,737,019 B1* | 6/2010 | Higgins et al. | 438/595 |
| 2001/0024857 A1* | 9/2001 | Parat et al. | 438/259 |
| 2002/0046874 A1* | 4/2002 | Cabral et al. | 174/137 R |
| 2004/0065903 A1 | 4/2004 | Zheng et al. | |
| 2005/0029573 A1 | 2/2005 | Sato et al. | |
| 2005/0095799 A1 | 5/2005 | Wang et al. | |
| 2005/0145950 A1 | 7/2005 | Chidambarrao et al. | |
| 2006/0152086 A1 | 7/2006 | Venezia et al. | |
| 2006/0194399 A1 | 8/2006 | Wen et al. | |
| 2008/0054365 A1* | 3/2008 | Aoyama | 257/369 |

* cited by examiner

*Primary Examiner* — Caridad Everhart

(57) ABSTRACT

A method of forming an integrated circuit includes providing a semiconductor substrate and forming a gate over the semiconductor substrate. A gate sidewall spacer is formed around the gate and a resist is deposited on the gate sidewall spacer with the gate sidewall spacer and the gate exposed. A portion of the gate within the gate sidewall spacer is removed and a gate silicide is formed within the curved gate sidewall spacer. A dielectric layer is formed over the gate silicide and a contact is formed to the gate silicide.

19 Claims, 4 Drawing Sheets

METHOD FOR CONTAINING A SILICIDED GATE WITHIN A SIDEWALL SPACER IN INTEGRATED CIRCUIT TECHNOLOGY

CROSS-REFERENCE TO RELATED APPLICATION

This is a continuation of co-pending U.S. patent application Ser. No. 11/075,999 filed Mar. 8, 2005.

TECHNICAL FIELD

The present invention relates generally to semiconductor technology, and more specifically to siliciding in semiconductor devices.

BACKGROUND ART

At the present time, electronic products are used in almost every aspect of life, and the heart of these electronic products is the integrated circuit. Integrated circuits are used in many portable electronic products, such as cell phone, portable computers, voice recorders, etc. as well as in many larger electronic systems, such as cars, planes, industrial control systems, etc.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

Integrated circuits are made up of hundreds to millions of individual components. One common component is the semiconductor integrated circuit transistor. The integrated circuit transistors contain polysilicon gates on silicon oxide gates, or gate oxides, over the silicon substrate. On the sides of the polysilicon gates, the silicon substrate is doped to become conductive. A curved silicon oxide or silicon nitride spacer, referred to as a "sidewall spacer", is formed on the sides of the polysilicon gate.

To complete the integrated circuit, a silicon oxide dielectric layer is deposited to cover the polysilicon gate, the curved spacer, and the silicon substrate. To provide electrical connections for the integrated circuit, openings are etched in the silicon oxide dielectric layer to the polysilicon gate and the source/drain junctions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain junction through the channel to the other source/drain junction and to the other source/drain contact.

As integrated circuits have decreased in size, it has been found that the electrical resistance between the metal contacts and the silicon substrate or the polysilicon has increased to the level where it negatively impacts the performance of the integrated circuits. To lower the electrical resistance, a transition material is formed between the metal contacts and the silicon substrate or the polysilicon. The best transition materials have been found to be cobalt silicide ($CoSi_2$) and titanium silicide ($TiSi_2$).

The silicide is formed by first applying a thin layer of the cobalt or titanium on the silicon substrate over the source/drain junctions and the polysilicon gates. The process is generally referred to as "siliciding". Since the shallow trench oxide and the sidewall spacers will not react to form a silicide, the silicides are aligned over the source/drain junctions and the polysilicon gates so the process is also referred to as "self-aligned siliciding", or "saliciding".

However, as integrated circuits have decreased even further in size, it has been discovered that problematic short-circuits are occurring in the transistors which appear to be related to the silicide.

Solutions to these problems have been long sought but prior developments have not taught or suggested any solutions and, thus, solutions to these problems have long eluded those skilled in the art.

DISCLOSURE OF THE INVENTION

The present invention provides a method of forming an integrated circuit including providing a semiconductor substrate and forming a gate over the semiconductor substrate. A gate sidewall spacer is formed around the gate and a resist is deposited on the gate sidewall spacer with the gate sidewall spacer and the gate exposed. A portion of the gate within the gate sidewall spacer is removed and a gate silicide is formed within the curved gate sidewall spacer. A dielectric layer is formed over the gate silicide and a contact is formed to the gate silicide In one embodiment of the present invention, short-circuiting between gate silicide and contact are eliminated, and in another embodiment of the present invention, short-circuiting between gate silicide and gate silicide are eliminated.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
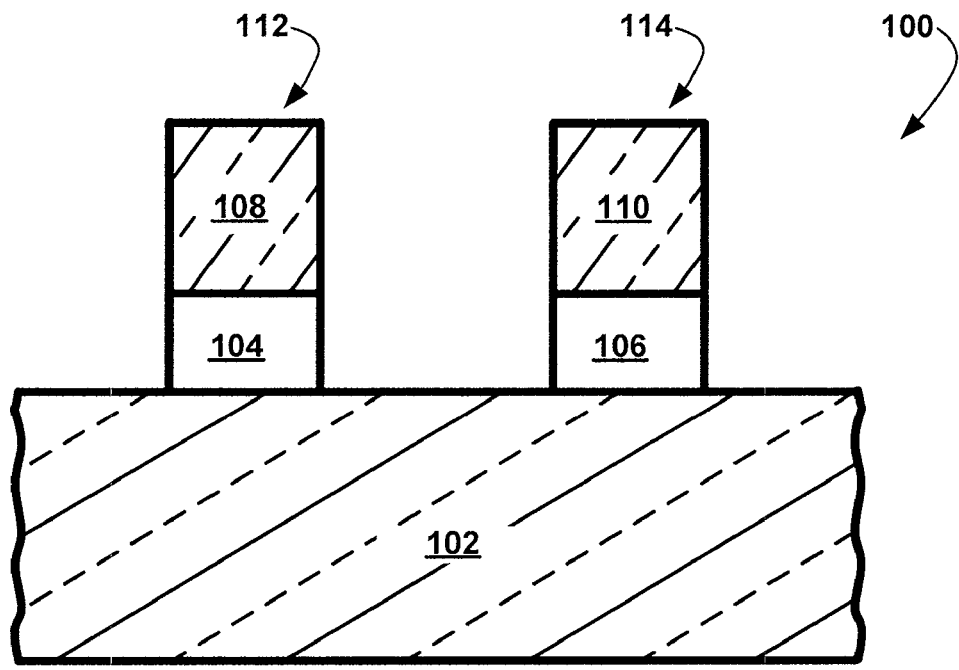
FIG. 1 is a view of an integrated circuit in an intermediate stage of fabrication in accordance with the present invention.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Referring now to FIG. 1, therein is shown an integrated circuit 100 in an intermediate stage of fabrication in accordance with the present invention.

To form the intermediate stage, a gate dielectric layer, such as silicon oxide or ONO, has been deposited on a semiconductor substrate 102 of a material such as silicon and a conductive gate layer, such as polysilicon, has been deposited over the gate dielectric layer. The layers are patterned and etched to form gate dielectrics 104 and 106. Gates 108 and 110 are formed over the gate dielectrics 104 and 106 to form semiconductor devices 112 and 114.

In another embodiment, the gates can have two layers consisting of a control gate and a floating gate.

Figure 2:
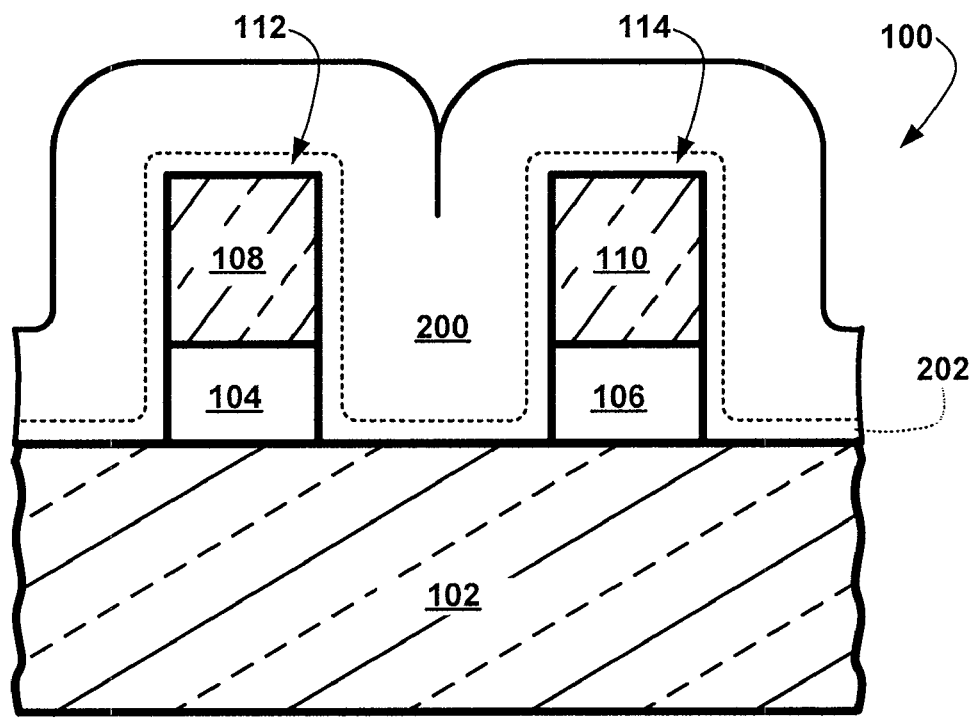
FIG. 2 is the structure of FIG. 1 with a spacer layer deposited thereon.

Referring now to FIG. 2, therein is shown the structure of FIG. 1 having a spacer layer 200 deposited thereon. The spacer layer 200, of a material such as silicon nitride, covers the semiconductor substrate 102, the gate dielectrics 104 and 106, and the gates 108 and 110. A liner layer 202 may be deposited before depositing the spacer layer 200, but the liner layer 202 is shown in dotted line because it is optional.

Figure 3:
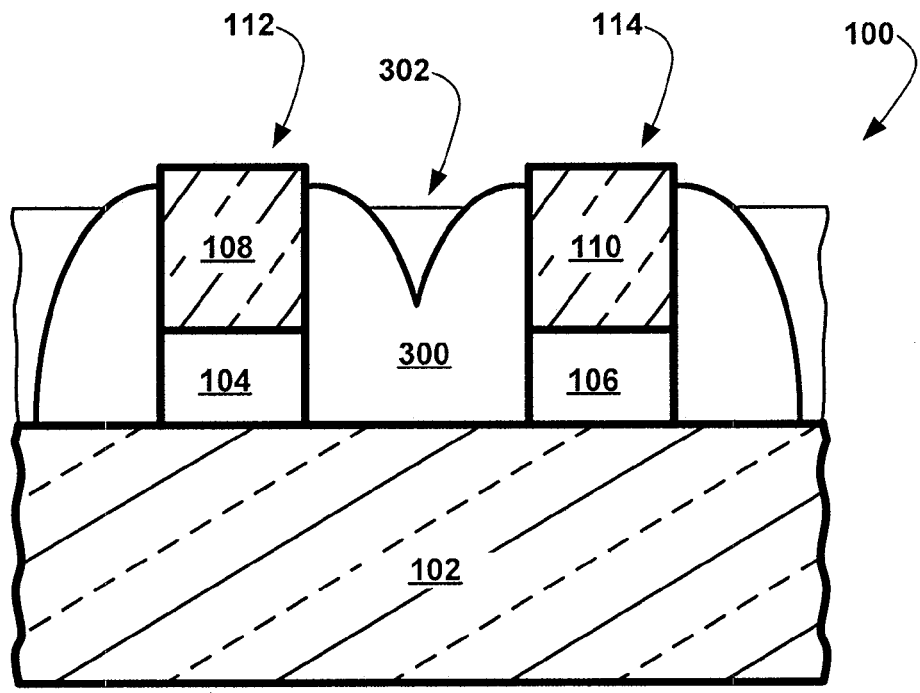
FIG. 3 is the structure of FIG. 2 after formation of a sidewall spacer and deposition of a resist.

Referring now to FIG. 3, therein is shown the structure of FIG. 2 after formation of a single curved gate sidewall spacer 300. The single curved gate sidewall spacer 300 is formed by etching.

Also shown in the figure is a layer of resist 302, which is deposited after formation of the curved sidewall spacer 300. The resist 302 is a spin on resist that is reflowed and descummed to clearly expose only the tops of the gates 108 and 110 and the top of the curved sidewall spacer 300.

Figure 4:
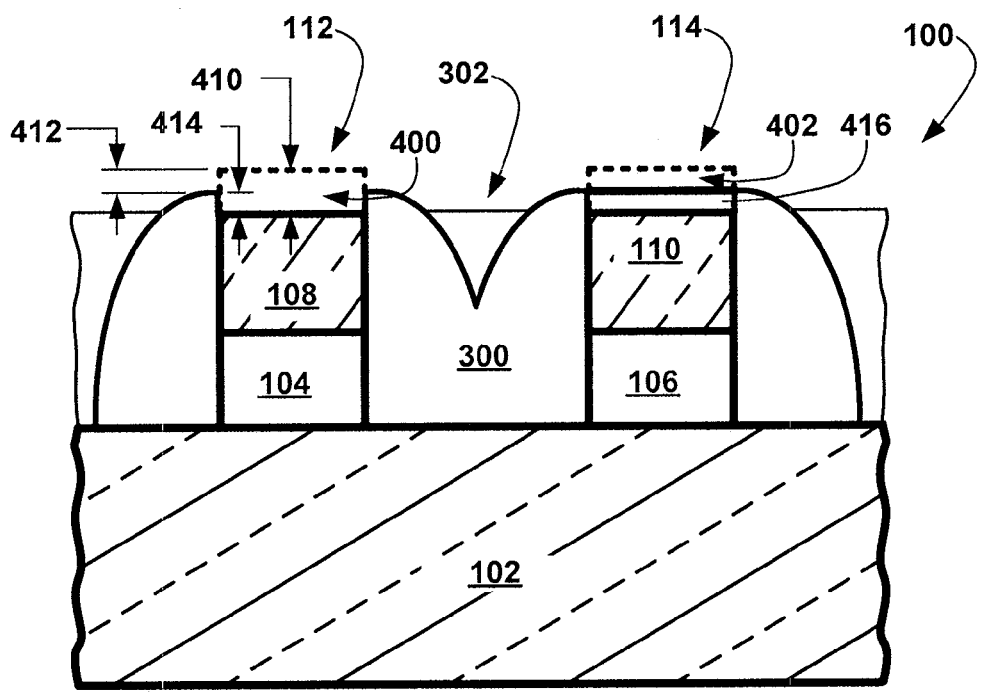
FIG. 4 is the structure of FIG. 3 after removal of portions of the gates.

Referring now to FIG. 4, therein is shown the structure of FIG. 3 after removal of portions 400 and 402 of the gates 108 and 110, respectively.

Using the portion 400 as an example, it has been discovered that a removal of a thickness 410 is desirable where the thickness 410 is substantially equal to a thickness 412 of the gate above the top of the single curved gate sidewall spacer 300 plus a thickness 414 substantially equal to the thickness of formed silicide 500 (of FIG. 5) below the top of the single curved gate sidewall spacer 300.

Figure 5:
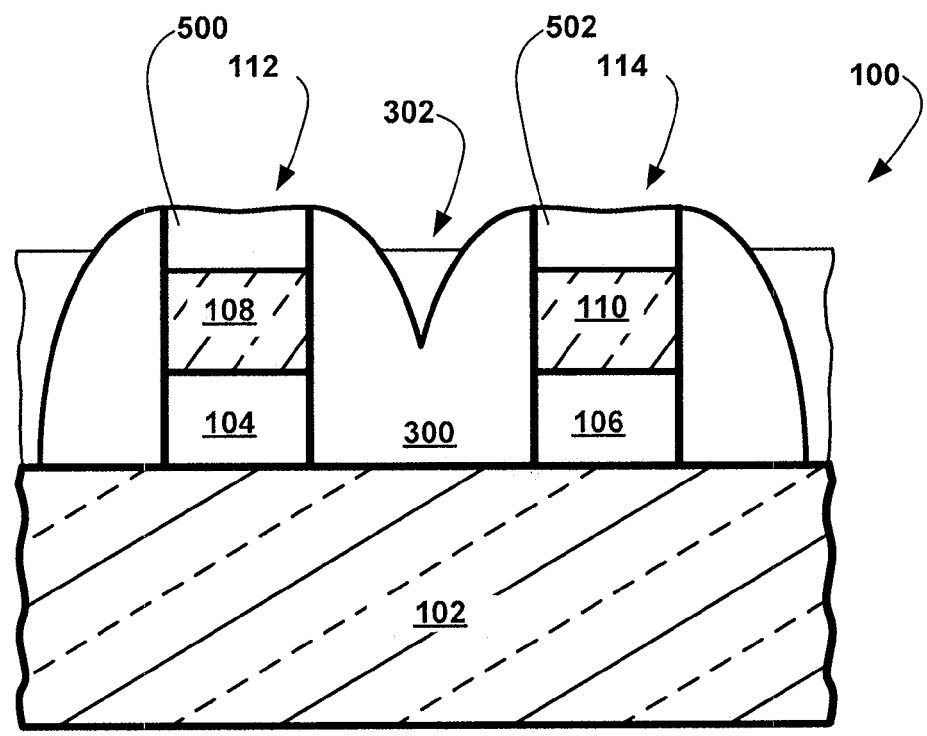
FIG. 5 is the structure of FIG. 4 after forming gate silicides.

Referring now to FIG. 5, therein is shown the structure of FIG. 4 after forming gate silicides 500 and 502. In the present invention, there are three ways in which to form gate silicides 500 and 502 after removal of the portions 400 and 402.

In one technique, a deposition process deposits a pure metal on the exposed polysilicon of the gates 108 and 110. Thereafter, the metal is reacted with the polysilicon to form what is known as a first phase, metal-rich silicide. The non-reacted metal is then removed, and the pre-existing first phase product is then reacted again with the underlying silicon to form a second phase, silicon-rich silicide.

In a second technique, the deposition process involves co-evaporation of both metal and silicon onto the exposed polysilicon. Both metal and silicon are vaporized by, for example, an electron beam. The vapor is then drawn onto the wafer and across the polysilicon.

In a third technique, the deposition process involves co-sputtering both metal and silicon onto the polysilicon surface. Co-sputtering entails physically dislodging metal and silicon materials from a composite target or separate targets, and then directing the composite material onto the wafer.

It has been discovered that the top of the gate silicide 500 should be about level with the top of the single curved gate sidewall spacer 300. This is accomplished by removing a thickness of the gate 108 below the top of the gate sidewall spacer 300 equal to the thickness of the refractory metal or the refractory metal and silicon that forms the gate silicide 500.

Previously, the metal or metal and silicon were deposited on the polysilicon gate above a spacer with substantially no removal process being performed on the polysilicon gate. It was believed that the metal would react downward into the silicon to form a silicide substantially within the spacers and most prior art drawings drew gate silicides with the top of the silicide level with the top of the spacers as a matter of drawing convenience.

It was only after extensive investigation that it was discovered that the silicide actually mushrooms (like a muffin in a bake pan). It was then further discovered that the silicide could mushroom to the extent that it could short circuit adjacent transistors. In some cases, the gate silicide could short circuit to the source or drain contact, and in other cases, adjacent gate silicides would short circuit.

The present invention, by controlling the siliciding, prevents the short circuits.

Figure 6:
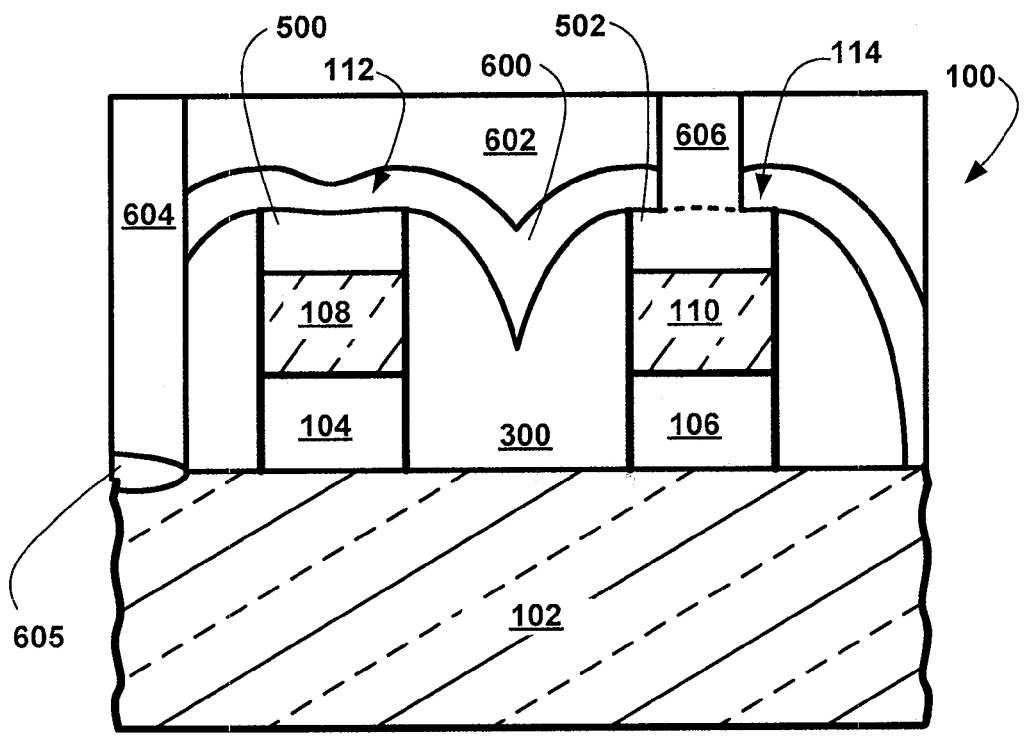
FIG. 6 is the structure of FIG. 5 after further completion of the integrated circuit.

Referring now to FIG. 6, therein is shown the structure of FIG. 5 after further completion of the integrated circuit 100.

The resist 302 of FIG. 5 is removed and a liner layer 600, such as an etch stop layer, is deposited over and in direct contact with the gate silicides 500 and 502 and the single curved gate sidewall spacer 300.

A dielectric layer 602 is then deposited over the liner layer 600.

In various embodiments, the dielectric layer 602 is of dielectric materials such as silicon oxide (SiOx), tetraethylorthosilicate (TEOS), borophosphosilicate (BPSG) glass, etc. with dielectric constants from 4.2 to 3.9 or low dielectric constant dielectric materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (SOB), diacetoxyditertiarybutosiloxane (DADBS), trimethylsilil phosphate (SOP), etc. with dielectric constants below 3.9 to 2.5.

Ultra-low dielectric constant dielectric materials, having dielectric constants below 2.5 and which are available, include commercially available Teflon-AF, Teflon microemulsion, polimide nanofoams, silica aerogels, silica xerogels, and mesoporous silica. Stop layers and capping layers (where used) are of materials such as silicon nitride (SixNx) or silicon oxynitride (SiON).

Contacts, such as a source or drain contact 604 is formed in the dielectric layer 602, the liner layer 600, and the single curved gate sidewall spacer 300 down to a source or drain silicide 605 in the semiconductor substrate 102. A gate contact 606 is formed in the dielectric layer 602 and the liner layer 600 to the gate silicide 502.

In various embodiments, the contacts 604 and 606 are of refractory metals such as tantalum (Ta), titanium (Ti), tungsten (W), alloys thereof, and compounds thereof. In other embodiments, the contacts 504 and 506 are of metals such as copper (Cu), gold (Au), silver (Ag), alloys thereof, and compounds thereof with one or more of the above refractory elements as diffusion barriers around them.

When the refractory siliciding metal is a metal such as titanium or cobalt, the silicide forms short-circuits between the contact and the gate silicide and/or the gate silicides because the single curved gate sidewall spacer becomes smaller with smaller integrated circuits. Even where a fully conductive path is not formed, capacitive-coupling will occur in the same regions, which will detrimentally affect performance.

Figure 7:
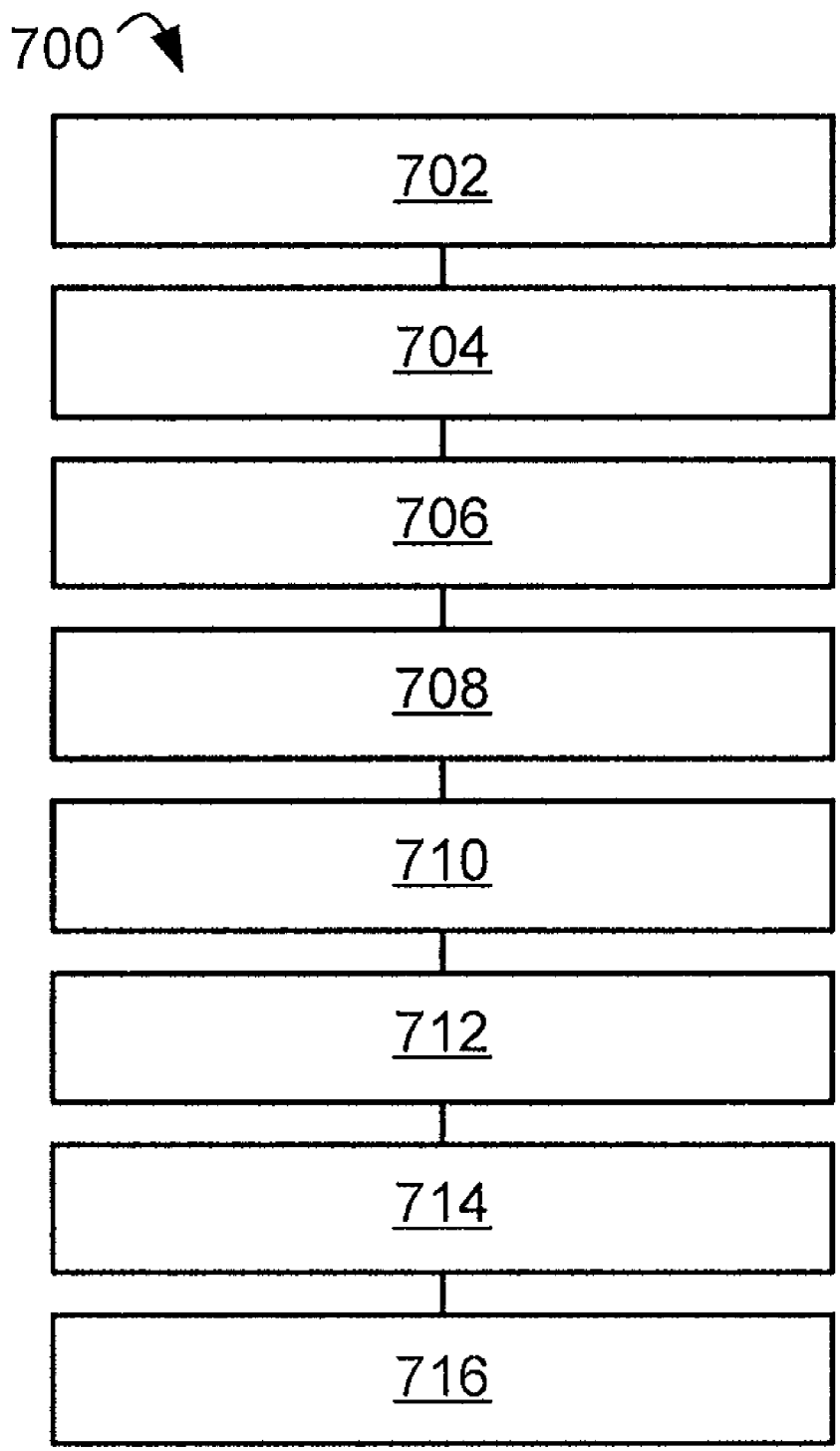
FIG. 7 is a simplified flow chart of the method of manufacturing the silicide in accordance with an embodiment of the present invention.

Referring now to FIG. 7, therein is shown a simplified flow chart of a method 700 in accordance with the present invention. The method 700 includes: providing a semiconductor substrate in a step 702; forming a gate over the semiconductor substrate in a step 704; forming a gate sidewall spacer around the gate in a step 706; depositing a resist on the gate sidewall spacer with the gate sidewall spacer and the gate exposed in a step 708; removing a portion of the gate within the gate sidewall spacer in a step 710; forming a gate silicide within the curved gate sidewall spacer in a step 712; depositing a dielectric layer over the gate silicide in a step 714; and forming a contact on the dielectric layer to the gate silicide in a step 716.

It has been discovered that an embodiment of the present invention reduces a known yield and reliability problem in logic and memory devices where protrusions from the silicide poly gate (and their proximity from changes in overlay margin) short-circuit contacts and cause row and column short-circuits (RACS) and increase capacitance. These same protrusions can also lead to short-circuits between polysilicon gates and wordlines, and also decrease the conformality of the overlying etch stop layer leading to weak spots, which is another precursor for RACS.

It has also been discovered that an embodiment of the present invention improves processing margins and resistance to silicide bridging due to either metal or silicon diffusing across the gate sidewall spacer.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. A method of forming an integrated circuit comprising:
   providing a semiconductor substrate;
   forming a gate over the semiconductor substrate;
   forming a sidewall spacer around the gate;
   depositing a resist on the gate sidewall spacer with the gate sidewall spacer and the gate exposed;
   removing a portion of the gate within the gate sidewall spacer;
   forming a gate silicide substantially within the sidewall spacer;
   depositing a liner layer in direct contact with the sidewall spacer and the gate silicide;
   depositing a dielectric layer over the gate silicide; and
   forming a contact in the dielectric layer to the gate silicide.

2. The method as claimed in claim 1 wherein depositing the liner layer includes depositing the liner layer over the gate silicide.

3. The method as claimed in claim 1 further comprising:
   forming a source or drain silicide on the semiconductor substrate; and
   forming an additional contact in the dielectric layer to the source or drain silicide.

4. The method as claimed in claim 1 wherein:
   removing a thickness of the gate below the top of the sidewall spacer at least equal to the thickness of the gate silicide.

5. The method as claimed in claim 1 wherein:
   removing a total thickness of the gate substantially equal to the thickness of the gate above the sidewall spacer plus the thickness of the gate silicide.

6. The method as claimed in claim 1 wherein:
   forming the gate silicide includes depositing metal or metal and silicon to a thickness substantially equal to the portion of the gate removed within the gate sidewall spacer.

7. The method as claimed in claim 1 wherein:
   forming the gate silicide uses a material selected from a group consisting of tantalum, titanium, tungsten, copper, gold, silver, an alloy thereof, a compound thereof, and a combination thereof.

8. A method of forming an integrated circuit comprising:
   providing a semiconductor substrate;
   forming first and second gate dielectrics on the semiconductor substrate;
   forming first and second gates respectively on the first and second gate dielectrics;
   forming a single curved gate sidewall spacer around the first and second gates;
   depositing a resist on the single curved gate sidewall spacer with the single curved gate sidewall spacer and the first and second gates exposed;
   removing portions of the first and second gates below the top of the single curved gate sidewall spacer;
   forming first and second gate silicides within the single curved gate sidewall spacer respectively over the first and second gates;
   depositing a liner layer in direct contact with the single curved gate sidewall spacer and the first and second gate silicide;
   depositing a dielectric layer over the first and second gate silicides; and
   forming a contact to the semiconductor substrate.

9. The method as claimed in claim 8 wherein depositing the liner layer includes depositing the liner layer over the first and second gate silicides.

10. The method as claimed in claim 8 further comprising:
    forming a source or drain silicide on the semiconductor substrate;
    forming an additional contact to the source or drain silicide; and
    forming a first contact to the first gate silicide.

11. The method as claimed in claim 8 wherein:
    removing a thickness of the gate below the top of the gate sidewall spacer equal to the thickness of the gate silicide.

12. The method as claimed in claim 8 wherein:
    removing a total thickness of the gate equal to the thickness of the gate above the gate sidewall spacer plus the thickness of the gate silicide.

13. The method as claimed in claim 8 wherein:
    forming the gate silicide includes depositing metal or metal and silicon to a thickness equal to the portion of the gate removed within the gate sidewall spacer.

14. The method as claimed in claim 8 wherein:
    forming the gate silicide uses a refractory material.

15. An integrated circuit comprising:
a semiconductor substrate;
first and second gate dielectrics over the semiconductor substrate;
a first and second gates on the first and second gate dielectrics;
a single curved gate sidewall spacer around the first and second gates;
first and second gate silicides substantially within the single curved gate sidewall spacer and respectively over the first and second gates;
a liner layer deposited in direct contact with the single curved gate sidewall spacer and the first and second gate silicides;
a dielectric layer over the first and second gate silicides; and
a gate contact to the first gate silicide.

16. The integrated circuit as claimed in claim 15 further comprising:
an additional gate contact to the second gate silicide;
a source or drain silicide on the semiconductor substrate; and
a contact to the source or drain silicide.

17. The integrated circuit as claimed in claim 15 wherein:
the gate silicides are below the tops of the single curved sidewall spacer.

18. The integrated circuit as claimed in claim 15 wherein:
the gate dielectric, the gate, and the gate silicide are below the top of the single curved sidewall spacer.

19. The integrated circuit as claimed in claim 15 wherein:
the gate silicide is a refractory silicide.

* * * * *